United States Patent [19]

Hayashi

[11] 4,456,977

[45] Jun. 26, 1984

[54] SEMICONDUCTOR MEMORY DEVICE

[75] Inventor: Mineo Hayashi, Tokyo, Japan

[73] Assignee: Nippon Electric Co., Ltd., Tokyo, Japan

[21] Appl. No.: 243,407

[22] Filed: Mar. 13, 1981

[30] Foreign Application Priority Data

Mar. 18, 1980 [JP] Japan ............................. 55-34443

[51] Int. Cl.³ .......................................... G11C 11/40
[52] U.S. Cl. ........................................ 365/51; 365/63
[58] Field of Search .................. 365/51, 63, 72, 174, 365/203, 205; 357/45; 307/530

[56] References Cited

U.S. PATENT DOCUMENTS 3,986,180 10/1976 Cade ................................. 365/149
4,031,522 6/1977 Reed et al. ..................... 365/186 X

FOREIGN PATENT DOCUMENTS 239567 5/1960 Australia ............................. 365/51

Primary Examiner—Joseph A. Popek
Attorney, Agent, or Firm—Sughrue, Mion, Zinn, Macpeak & Seas

[57] ABSTRACT

A semiconductor memory device having a large memory capacity and an improved read-out function is disclosed. The device comprises a plurality of word lines extended in the row direction, a plurality of pairs of data lines extended in the column direction and arranged in parallel, a plurality of memory cells arranged at the cross-points between the word lines and the data lines, and a plurality of sense amplifiers each coupled to each pair of the data lines, and is featured in that n (an integer of two or more) sense amplifiers are arrayed respectively in the column direction and are arranged for every n pairs of data lines in the row direction.

13 Claims, 7 Drawing Figures

SEMICONDUCTOR MEMORY DEVICE

BACKGROUND OF THE INVENTION

The present invention relates to a semiconductor memory device fabricated on a semiconductor substrate.

As a memory device having a large memory capacity, a semiconductor memory device employing dynamic memory cells has been widely utilized. One example of such type of semiconductor memory device is disclosed in detail in U.S. Pat. No. 4,031,522. In such a memory device, e.g., a memory cell, the so-called "single transistor type of cell" consisting of one transfer gate transistor and one capacitor is used. Each pair of two adjacent data lines extending in the column direction are adapted to be coupled to two inputs of corresponding one of differential type sense amplifiers arrayed in a row direction. In a memory device having the aforementioned construction, upon reading, the electric charge which has been already stored in the capacitor of the memory cell depending upon the information written into the memory cell is necessarily divided between the capacitance of the memory cell capacitor and the capacitance of the data line, and hence, the resultant voltage, that is, the voltage on the data line produced by the divided electric charge must be detected by the sense amplifier.

In general, a size of memory cells and especially a size of capacitors in the memory cells tends to be reduced as a memory capacity is successively increased to 64K bits, 256K bits, 1M bits and so on. This implies reduction of the electric charge stored in a capacitor of a memory cell, and results in an extremely small read signal. On the other hand, since a sense amplifier is provided for each corresponding pair of two adjacent data lines, the reduction of the size of the memory cells naturally results in reduction of the pitch of the array of the data lines, and accordingly the sense amplifiers are also compelled to reduce their respective pitch, i.e., the width in the row direction, to the extent corresponding to the reduction in size of the memory cells. Hence, realization of a high sensitivity of sense amplifier has been greatly prohibited. In other words, this means that if sense amplifiers having a high sinsitivity require on a relatively large chip area, then a high density integration of a large capacity memory cannot be achieved.

Further, since the width of an area assigned for a sense amplifier is limited within the interval of paired data lines, the length of the area inevitably becomes very large. This makes the area a very lengthy rectangular shape which is unfavorable for effective realization of the sense amplifier.

For this reason, as memory capacities have been successively increased, it has become very difficult to accommodate the aforementioned sense amplifier in one pitch of the memory cell array, and this was one of the obstacles against realization of a high density memory device in the prior art. Furthermore, in accordance with the reduction in size of memory cells, enhancement of a sensitivity of a sense amplifier has been required, but it has also been difficult with present circuit technique to realize highly sensitive sense amplifiers under a limited pitch condition of the array.

SUMMARY OF THE INVENTION

It is therefore one object of the present invention to provide a semiconductor memory device having an increased integration density.

Another object of the present invention is to provide a semiconductor memory device having an enhanced read-out function.

In the present invention, a plurality of sense amplifiers are divided into a number of groups each consisting of a given number of sense amplifiers. The sense amplifiers in each group are arrayed in a first direction, for example, in the column direction, and said number of sense amplifier groups are arrayed along a second direction perpendicular to the first direction, for example, in the row direction, at a pitch or an interval extending over said given number of pairs of data lines.

Namely, according to the present invention, in a memory device comprising a plurality of word lines extended in a row direction, a plurality of pairs of data lines extended in a column direction and arranged in parallel, a plurality of memory cells arrayed at the cross-points between said word lines and said data lines, and a plurality of sense amplifiers each coupled to each pair of the data lines, n (n represents an integer of 2 or more) sense amplifiers are respectively arrayed in the column direction and are arranged for every n pairs of the data lines in the row direction.

According to the present invention, each sense amplifier can have a sufficient width near a distance occupied by two or more data lines and hence an area to be assigned for each sense amplifier can have an adequate shape. This contributes to a high-density and high-sensitivity structure of the memory device.

According to one aspect of the invention, there is provided a semiconductor memory device comprising first to fourth data lines extending in a first direction and arranged in parallel, a plurality of word lines intersecting with the first to fourth data lines, a plurality of memory cells desposed at intersections of the word lines and the data lines, a first sense amplifier arranged near first ends of the first to fourth data lines, a second sense amplifier arranged adjacent to the first sense amplifier in the first direction, first connecting means for connecting a first pair of the first ends of the first to fourth data lines to a pair of input terminals of the first sense amplifier, and second connecting means for connecting a second pair of the first ends of the first to fourth data lines to a pair of input terminals of the second sense amplifier.

According to another aspect of the present invention, there is provided a semiconductor memory device comprising a first pair of data lines extending in a first direction and in parallel, a second pair of data lines extending in the first direction and in parallel, the second pair of data lines being arranged in parallel with and adjacent to the first pair of data lines, a plurality of word lines extending in a second direction perpendicular to the first direction and intersecting with the data lines, a plurality of memory cells disposed at intersections of the word lines and the data lines, first and second sense amplifiers arranged in the first direction and at a side of first ends of the data lines, the first and second sense amplifiers being formed with a width over the first and second pairs of digit lines in the second direction, first means for connecting the first ends of the first pair of data lines to a pair of input terminals of the first sense amplifier and second means for connecting the first ends of the second pair of data lines to a pair of input terminals of the second sense amplifier.

According to still another aspect, there is also provided a semiconductor memory device comprising a first pair of data lines extending in a longitudinal direction and in parallel, a second pair of data lines sandwiching the first pair of data lines, a plurality of word lines intersecting with the data lines, a plurality of memory cells disposed at the intersections of the word lines and the data lines, a first sense amplifier having a side facing the first ends of the first and second pairs of data lines, a second sense amplifier having a first side facing a second and opposite side of the first sense amplifier, said first and second sense amplifiers being arranged in the longitudinal direction, the first sides of the first and second sense amplifiers being larger than a distance between the first data lines and smaller than a distance between the second pair of digit lines in a lateral direction.

According to still another aspect of the present invention, there is provided a semiconductor memory device, in which a plurality of data line pairs each consisting of two data lines connected to two inputs of an associated one of said plurality of sense amplifiers are arranged in parallel to each other at a predetermined interval, and within a given number of said predetermined intervals, sense amplifiers corresponding to the data line pairs therein are arrayed along the same direction as the data lines.

BRIEF DESCRIPTION OF THE DRAWINGS

The above-mentioned features and objects of the present invention will become more apparent by reference to the following description of preferred embodiments of the invention taken in conjunction with the accompanying drawings, wherein.

DETAILED DESCRIPTION OF THE PREFERRED EMBODIMENTS

Figure 1:
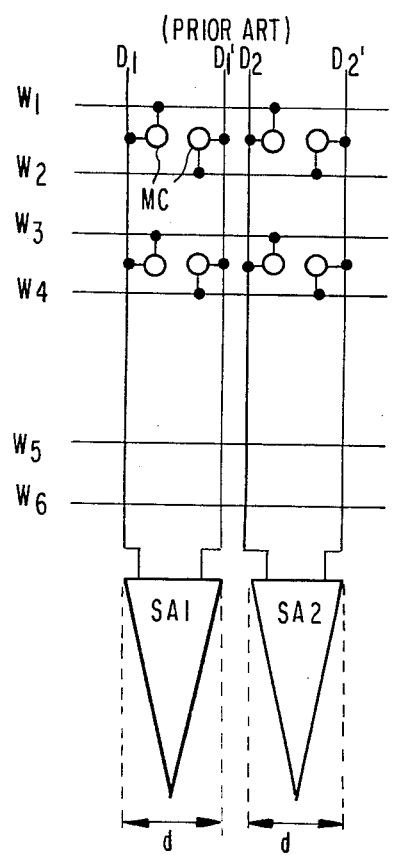
FIG. 1 is a block diagram showing one example of a memory device in the prior art.

One example of a layout of a memory device in the prior art is shown in FIG. 1. With reference to FIG. 1, two pairs of data lines ($D_1$, $D_1'$) and ($D_2$, $D_2'$) connected to the respective two inputs of sense amplifiers SA1 and SA2 are arrayed in parallel to each other, and the sense amplifiers are disposed only on the side of the same terminal ends of the data lines. In such type of array, a layout pitch (or interval) 'd' of the sense amplifiers corresponds to a pitch of the memory cells connected to a pair of data lines. Accordingly, it was difficult to realize a sense amplifier having a high sensitivity higher than the sensitivity of the sense amplifier having an occupation area limited by this pitch 'd'. On the contrary, if a memory array is laid out on the basis of the pitch 'd' corresponding to the occupation area of a sense amplifier necessitated for attaining a desired sensitivity, then it was impossible to array memory cells at a high density.

Now a memory device according to one preferred embodiment of the present invention will be described with reference to FIG. 2.

In the illustrated embodiment, each memory cell MC consists of the well-known "single transistor type" memory cell. Word lines $W_1$ to $W_6$ adapted to be driven by row decoders 12 intersect with data lines (digit lines) $D_1$, $D_2$, $D_2'$, $D_1'$ ... $D_4'$, $D_3'$, and at the intersections between the word line and data lines are disposed memory cells MC as shown in FIG. 2. What is characteristic of this memory layout structure resides in the method of arraying the data lines ($D_1$, $D_1'$), ($D_2$, $D_2'$), ($D_3$, $D_3'$), ($D_4$, $D_4'$), etc. such that with respect to the data line pairs ($D_1$, $D_1'$) and ($D_2$, $D_2'$), the pair of data lines ($D_1$, $D_1'$) are disposed so as to sandwich the data line pair ($D_2$, $D_2'$), and the respective sense amplifiers SA1 and SA2 are disposed as aligned in the direction of data lines so as to adapt to the positions of the data lines. Owing to such an array, it becomes possible to lay out the sense amplifiers SA1 and SA2 of a differential type within a width that is about twice as large as the width reserved for each sense amplifier in the prior art. In other words, even in the case where the width of the area for the sense amplifier is limited, it become possible to realize a density of the memory cell array that is about twice as high as that in the prior art. The set of data line pairs ($D_3$, $D_3'$) and ($D_4$, $D_4'$) are also arrayed in a similar manner so that one data line pair may sandwich the other data line pair. In this layout, the sense amplifiers SA1 to SA4 can be formed with a width over two data line pairs. The data amplified and detected by the sense amplifiers SA1, SA2, ..., SA3 and SA4 are selectively transmitted to data buses DB and DB' via a gate circuit 16 which is controlled by outputs of column decoders 11, and then output via an output amplifier 13. To the data buses DB and DB' are coupled to write gates 15 and 14, respectively, so that true and complementary inputs IN and $\overline{IN}$ may be transmitted to the data buses in response to a write signal W. In the illustrated embodiment, memory cells connected to adjacent data lines such as, $D_1$ and $D_2$, respectively, are connected to the same word line such as, for example, $W_1$, and so one contact to a word line could be provided for every two adjacent memory cells. Therefore, the layout accoding to the first preferred embodiment illustrated in FIG. 2 is also advantageous for reduction in the size of a memory cell.

Figure 3:
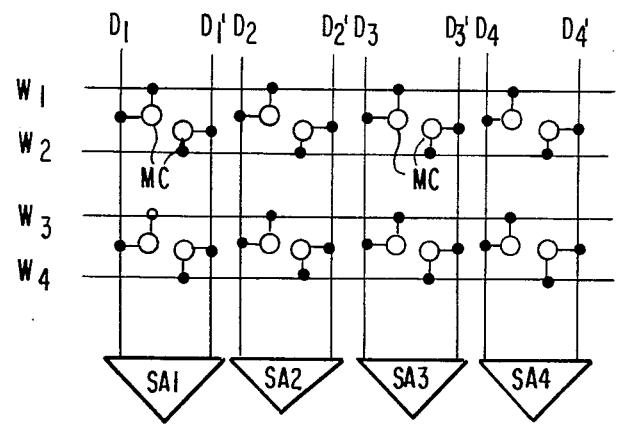
FIG. 3 is a block diagram showing a memory device according to another preferred embodiment of the present invention.

Another preferred embodiment of the present invention will be now described with reference to FIG. 3. In the illustrated embodiment, the data lines $D_1$, $D_1'$, $D_2$ and $D_2'$ are arrayed in a similar manner to the conventional layout, but the respective two sense amplifiers SA1 and SA2 are disposed as aligned in the same direction of the data lines. According to this method of arraying sense amplifiers, the restriction on the pitch in the lateral direction (the direction of word lines) i.e. a width of the sense amplifiers, can be widely mitigated.

In the following, the effects and advantages of the present invention will be set forth in greater detail with reference to FIGS. 4 to 6. In the following description, comparison will be made between the case where sense amplifiers having a circuit construction shown in FIG. 4 are laid out according to the prior art layout illustrated in FIG. 1 and the case where the same sense amplifiers are laid out according the first preferred embodiment of the present invention illustrated in FIG. 2.

Figure 4:
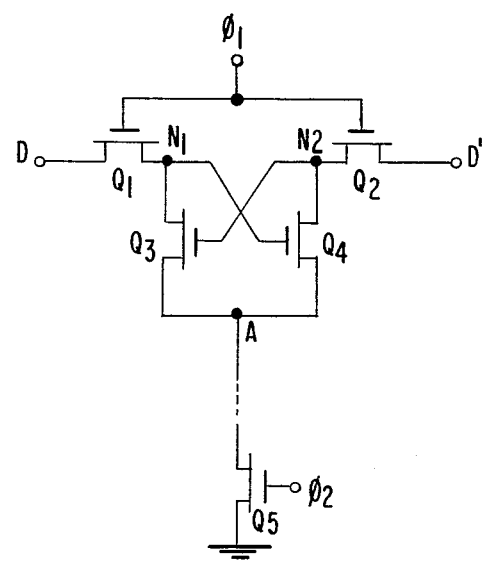
FIG. 4 is a circuit diagram showing a conventional sense amplifier.

The sense amplifier shown in FIG. 4 is a conventional sense amplifier, in which the drains and gates of transistors $Q_3$ and $Q_4$ are cross-connected, and the respective cross-connection points $N_1$ and $N_2$ are coupled to data line input terminals D and D', respectively, via transfer gate transistors $Q_1$ and $Q_2$ having a clock $\phi$ applied to their gates. A common source junction point A for the transistors $Q_3$ and $Q_4$ is grounded via a latch control transistor $Q_5$. In operation, at first a clock $\phi_1$ rises to bring the nodes $N_1$ and $N_2$ to the potentials corresponding to the potentials on the data lines D and D', respectively, and thereby a potential difference is generated between the nodes $N_1$ and $N_2$. Subsequently, a clock $\phi_2$ rises to make the transistor $Q_5$ conduct, and thereby the potential difference between the nodes $N_1$ and $N_2$ is amplified. Here it is to be noted that the node A is provided in common to the respective sense amplifiers. In other words, the transistor $Q_5$ is shared by a plurality of sense amplifiers each including the transistors $Q_1$, $Q_2$, $Q_3$ and $Q_4$.

Figure 5:
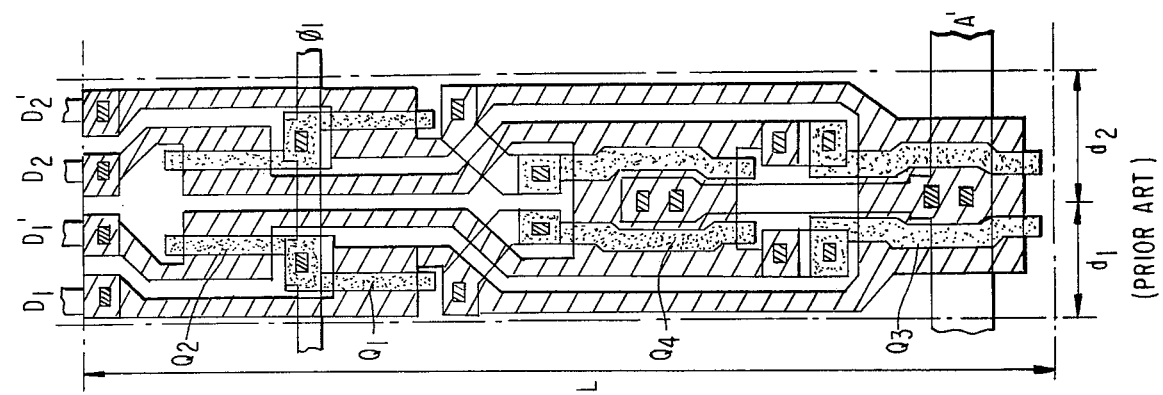
FIG. 5 is a plan view showing two sense amplifiers each having the circuit construction illustrated in FIG. 4, as built according to the layout shown in FIG. 1.

FIG. 5 shows one example of a memory device section in which the sense amplifiers shown in FIG. 4 are laid out according to the prior art array shown in FIG. 1. With reference to FIG. 5, within an area defined by a lateral pitch '$d_1$' in the row direction and a longitudinal pitch L in the column direction is laid out the sense amplifier SA1 in FIG. 1. Within an area defined by a lateral pitch '$d_2$' in the row direction and a longitudinal pitch L in the column direction is laid out the sense amplifier SA2 in FIG. 1. In this example, the transistors $Q_1$ and $Q_2$ have silicon gate structures which have electrical connection to the signal line $\phi_1$ made of aluminum through contacts.

The node A is connected in common to an aluminum wiring A' that is provided in common to all the sense amplifiers SA1 and SA2. In this figure, the transistors $Q_1$ to $Q_4$ of the sense amplifier of FIG. 4 are shown by the same reference codes with respect to the sense amplifier SA1. The layout of the transistors of the sense amplifier SA2 is symmetrical to that of SA2 and self explanatory.

Figure 2:
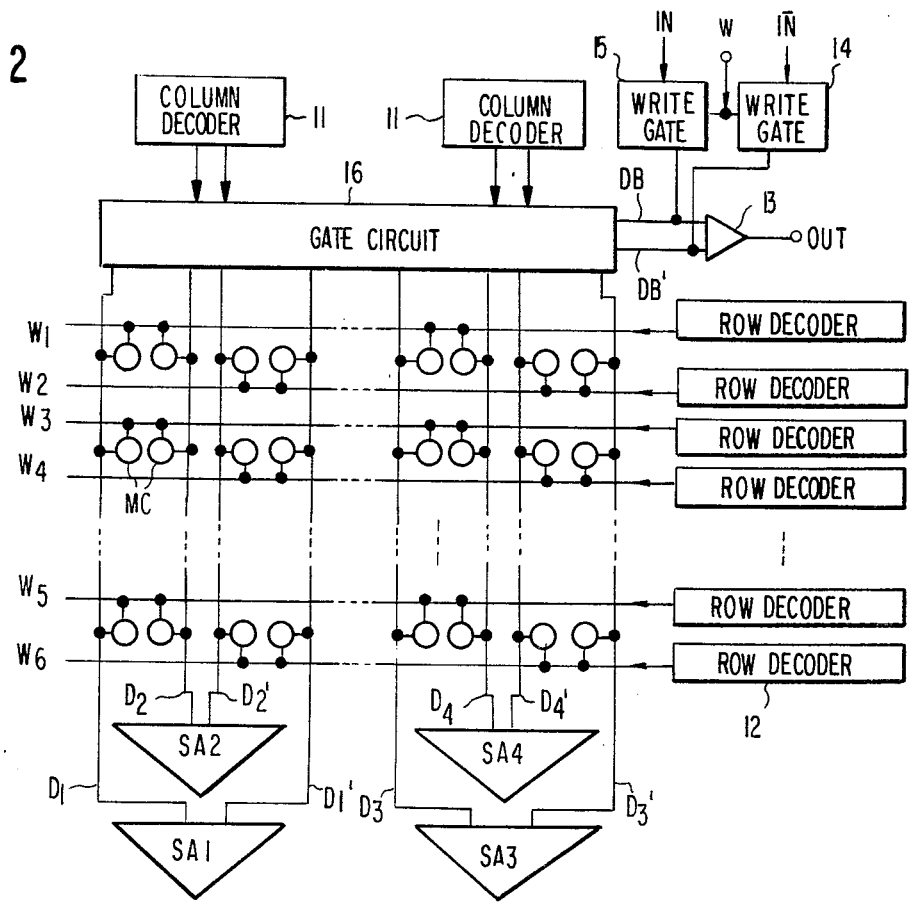
FIG. 2 is a block diagram showing a memory device according to one preferred embodiment of the present invention.
Figure 6:
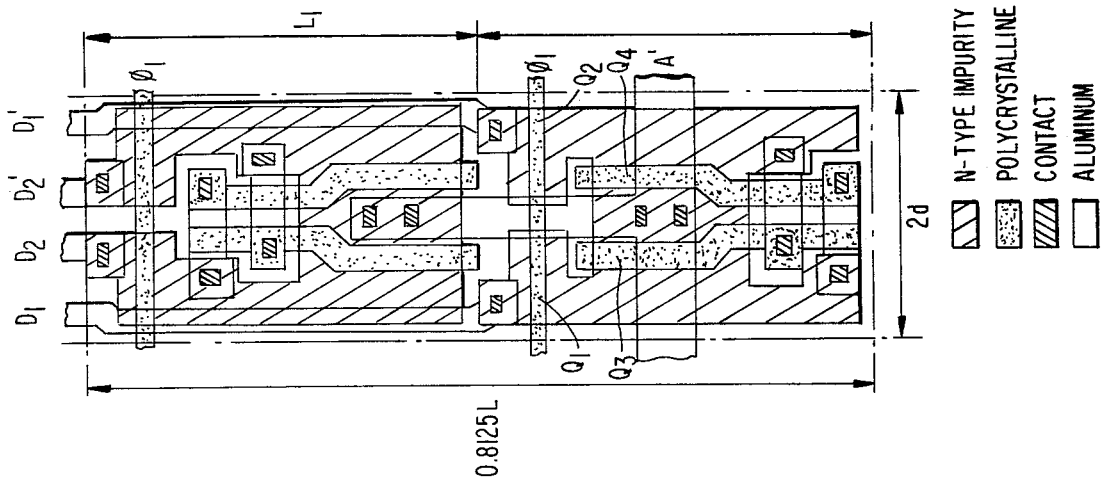
FIG. 6 is a plan view showing two sense amplifiers each having the circuit construction illustrated in FIG. 4, as built according to the layout shown in FIG. 2.

FIG. 6 shows one example of a memory device section in which the sense amplifiers shown in FIG. 4 are laid out according to the first preferred embodiment of the present invention illustrated in FIG. 2. This layout has a lateral interval of '2d' in the row direction that is equivalent to twice the pitch '$d_1$' or '$d_2$', and the sense amplifier SA2 is constructed in an area defined by this pitch '2d' in the row direction and a longitudinal pitch '$L_1$' in the column direction. In addition, the other sense amplifier SA1 is constructed in an area defined by this pitch '2d' in the row direction and a longitudinal pitch $L_2$ next to the pitch $L_1$ in the column direction. In this figure, also, the reference codes of the transistors are given to the sense amplifier SA1. The sense amplifier SA2 has the same transistor layout. In this layout, although signal lines $\phi_1$ made of a polycrystalline silicon are arrayed in the respective regions within the intervals $L_1$ and $L_2$, it will be readily appreciated that even if the respective pitches $L_1$ and $L_2$ are added together, the sum of the pitches $L_1$ and $L_2$ is smaller by about 20% than the pitch L shown in FIG. 5.

For instance, in the illustrated example, with respect to two sense amplifiers SA1 and SA2, an area of $(1-0.8125) L \times 2d = 0.375$ Ld can be reduced. Accordingly, in the case of a large capacity memory device in which 100 or more sense amplifiers are provided, the effects and advantages attained by the present invention will be further enhanced. It is also to be noted that as the pitch 'd' of the data lines is reduced, the effects and advantages of the present invention will become more remarkable.

Figure 7:
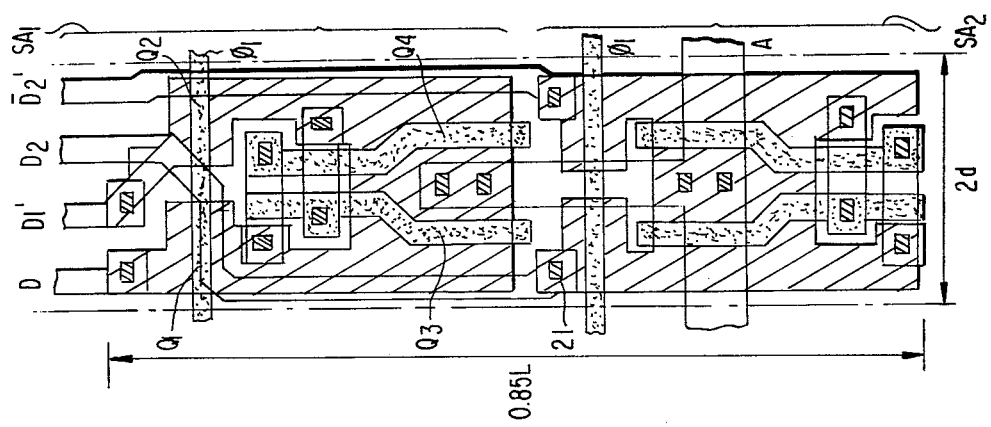
FIG. 7 is a plan view of a pair of sense amplifiers realized according to the embodiment of FIG. 3.

With reference to FIG. 7, one detailed layout example of the sense amplifiers SA1 and SA2 in the embodiment of FIG. 3 will be explained.

In this figure, transistors $Q_1$ to $Q_4$ forming the sense amplifier SA1 are arranged similarly to the case of FIG. 6 and the layout of the sense amplifier SA2 is also similar to that. Since the pair of data lines $D_2$ and $D_2'$ are arranged in parallel and adjacent each other and it is impossible to connect the data line $D_2$ to a contact 21 as an input of the sense amplifier by a substantially linear wiring pattern, the data line $D_2$ made of aluminum wiring layer is bent once towards the left direction near the signal line $\phi_1$ of a polycrystalline silicon on the sense amplifier SA1 and then extending toward the contact 21.

In this embodiment, if the width of the sense amplifiers is '2d', the length of two sense amplifiers becomes 0.85 L. Thus reduction in area by about 15 percent can be achieved in comparison with the prior art layout technique.

While the principle of the present invention has been described above in connection with its particular preferred embodiments, it is intended that the present invention should not be limited to the above-described preferred embodiments, but it could be applied to any type of memory device.

I claim:

1. A semiconductor memory device comprising first and second pairs of data lines extending in a first direction in parallel, a plurality of word lines intersecting with said data lines, a plurality of memory cells disposed at intersections of said word lines and said data lines, a first sense amplifier arranged near first ends of said first and second pairs of data lines, a second sense amplifier arranged adjacently to said first sense amplifier in said first direction, first connecting means for connecting said first ends of said pair of data lines to a pair of input terminals of said first sense amplifier, second connecting means for connecting said first ends of said second pair of data lines to a pair of input terminals of said second sense amplifier, a pair of bus lines, and gate means disposed near second ends of said data lines, said gate means operatively connecting two of said data lines to said pair of bus lines.

2. A semiconductor memory device comprising first and second pairs of data lines extending in a first direction and arranged in parallel, a plurality of word lines extending in a second direction normal to said first direction and intersecting with said data lines, a plurality of memory cells disposed at intersections of said data lines and said word lines, a first sense amplifier having a first side adjacent to first ends of both of said first and second pairs of data lines and formed on an area having a width which substantially corresponds to a distance between the remotest two data lines among said first and second pairs of data lines in said second direction, a second sense amplifier having a first side adjacent to a second opposite side of said first sense amplifier and formed on an area with substantially the same width as that of said first sense amplifier in said second direction, each of said first and second sense amplifiers including first to third nodes, a first transistor coupled between said first node and said third node and having a gate coupled to said second node, a second transistor coupled between said second node and said third node and having a gate coupled to said first node, a third transistor coupled between said first node and one of an associated pair of data lines and a fourth transistor coupled between said second node and the other of the associated pair of data lines, first connecting means for connecting said first pair of data lines to a pair of input terminals of said first sense amplifier and second connecting means for connecting said second pair of data lines to a pair of input terminals of said second sense amplifier.

3. The device according to claim 2, further comprising a pair of bus lines and gate means disposed near second ends of said data lines, said gate means operatively connecting two of said data lines to said pair of bus lines.

4. A semiconductor memory device comprising first to fourth data lines sequentially arrayed in parallel and extending in a first direction, a plurality of word lines intersecting with said data lines, a plurality of memory cells arrayed at intersections of said data lines and said word lines, a first sense amplifier formed on a first region adjacent to first ends of all of said first to fourth data lines, a length of said first region in a second direction perpendicular to said first direction being substantially equal to a distance between said first data line and said fourth data line, a second sense amplifier formed on a second region adjacent to said first region in said first direction, a length of said second region in said second direction being substantially equal to the distance between said first data line and said fourth data line, means for connecting two of said first to fourth data lines to a pair of input terminals of said first sense amplifier, and means for connecting the other two of said first to fourth data lines to a pair of input terminals of said second sense amplifier, each of said first and second amplifiers including a first transistor coupled between a first node and a second node and having a gate coupled to a third node, a second transistor coupled between said third node and said second node and having a gate coupled to said first node, a first connection means for connecting said first node to one of said pair of input terminals and a second connection means for connecting said third node to the other of said pair of input terminals.

5. The memory device according to claim 4, further comprising a pair of bus lines and gate means disposed near second ends of said data lines, said gate means operatively connecting a selected two of said data lines to said pair of bus lines.

6. The memory device according to claim 4, in which said first and fourth data lines are connected to the pair of input terminals of said first sense amplifier while said second and third data lines are connected to the pair of input terminals of said second sense amplifier.

7. The memory device according to claim 4, in which said first and second data lines are connected to the pair of input terminals of said first sense amplifier while said third and fourth data lines are connected to the pair of input terminals of said second sense amplifier.

8. A semiconductor memory device comprising a plurality of data lines arrayed in sequence with a first pitch in a first direction, each of said data lines extending in a second direction normal to said first direction, a plurality of first sense amplifiers arrayed in sequence with a second pitch in said first direction along first ends of said data lines, said second pitch having a value twice that of said first pitch, and a plurality of second sense amplifiers arrayed in sequence with said second pitch in said first direction along an array of said first sense amplifiers, each of said first and second amplifiers including a first transistor coupled between a first node and a second node and having a gate coupled to a third node, a second transistor coupled between said third node and said second node and having a gate coupled to said first node, a first connection means for connecting said first node to one of a pair of input terminals and a second connection means for connecting said third node to the other of said pair of input terminals, in which two of four consecutive data lines are adapted to be connected to a pair of input terminals of an associated one of said first sense amplifiers and other two of said four consecutive data lines are connected to a pair of input terminals of an associated one of said second sense amplifiers.

9. The device according to claim 8, further comprising a pair of bus lines and gate means disposed near second ends of said data lines, said gate means operatively connecting two of said data lines to said pair of bus lines.

10. A semiconductor memory device comprising a plurality of data lines arrayed in sequence with a first pitch in a first direction, each of said data lines extending in a second direction normal to said first direction, a plurality of first sense amplifiers arrayed in sequence with a second pitch in said first direction along first ends of said data lines, said second pitch having a value twice that of said first pitch, a pair of bus lines, gate means disposed near second ends of said data lines and operatively connecting two of said data lines to said pair of bus lines, and a plurality of second sense amplifiers arrayed in sequence with said second pitch in said first direction along an array of said first sense amplifiers, in which two of four consecutive data lines are adapted to be connected to a pair of input terminals of an associated one of said first sense amplifiers and the other two of said four consecutive data lines are connected to a pair of input terminals of an associated one of said second sense amplifiers.

11. A semiconductor memory device comprising first to fourth data lines sequentially arrayed in parallel and extending in a first direction, first and second word lines intersecting with said first to fourth data lines, first and second memory cells adjacent each other and formed on a region near the intersections of said first and second data lines and said first word lines, said first memory cell being connected to said first data line and said first word line, said second memory cell being connected to said second data line and said first word line, and third and fourth memory cells adjacent each other and formed on a region near the intersections of said third and fourth data lines and said second word line, said third memory cell being connected to said third data line and said second word line, said fourth memory cell being connected to said fourth data line and said second word lines.

12. The memory device according to claim 11, further comprising a first sense amplifier having a pair of input terminals coupled to two of said first to fourth data lines, and a second sense amplifier having a pair of input terminals coupled to the other two of said first to fourth data lines, said first and second sense amplifiers being arranged near first ends of said first to fourth data lines, each of said first and second sense amplifiers including a first transistor coupled between a first node and a second node and having a gate coupled to a third node, a second transistor coupled between said third node and said second node and having a gate coupled to said first node, a first connection means for connecting said first node to one of said pair of input terminals and a second connection means for connecting said third node to the other of said pair of input terminals.

13. The memory device according to claim 11, further comprising a pair of bus lines and gate means disposed near second ends of said data lines, said gate means operatively connecting a selected two of said data lines to said pair of bus lines.

* * * * *